United States Patent
Grillo et al.

(10) Patent No.: US 6,975,166 B2
(45) Date of Patent: Dec. 13, 2005

(54) POWER AMPLIFIER

(75) Inventors: Giuseppe Grillo, Eindhoven (NL); Pepijn Willebrord Justinus Van De Ven, Castletroy (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/499,624

(22) PCT Filed: Dec. 19, 2002

(86) PCT No.: PCT/IB02/05649

§ 371 (c)(1),
(2), (4) Date: Jun. 21, 2004

(87) PCT Pub. No.: WO03/056698

PCT Pub. Date: Jul. 10, 2003

(65) Prior Publication Data

US 2005/0151586 A1    Jul. 14, 2005

(30) Foreign Application Priority Data

Dec. 24, 2001 (EP) .................... 01205081

(51) Int. Cl.[7] .................................. H03G 3/20
(52) U.S. Cl. ........................ 330/136; 330/297
(58) Field of Search .................. 330/136, 129, 330/10, 285, 296, 297

(56) References Cited

U.S. PATENT DOCUMENTS

| | | | |
|---|---|---|---|
| 4,831,334 A | 5/1989 | Hudspeth | |
| 5,880,633 A | 3/1999 | Leizerovich | |
| 6,137,355 A | 10/2000 | Sevic | |
| 6,714,071 B1 * | 3/2004 | Page | 330/136 |
| 6,725,021 B1 * | 4/2004 | Anderson et al. | 455/115.1 |
| 6,741,127 B2 * | 5/2004 | Sasho et al. | 330/136 |

OTHER PUBLICATIONS

"High Efficiency CDMA RF Power Amplifier using Dynamic Envelope Tracking Technique", by J. Staudinger, IEEE MTT-S Jun. 2000, pp. 873-876.

* cited by examiner

*Primary Examiner*—Henry Choe

(57) ABSTRACT

The present invention relates to a power amplifier being preferably applied in mobile communication devices andusing an envelope tracking technique. It is the object of the invention to improve a power amplifier with respect to its efficiency by simultaneously enabling an adaptation of the supply voltage for the unit 110 to fast variations of an envelope signal. This object is achieved by providing a second DC/DC converter 140 for generating a variety of n+1 voltage levels and n threshold values both in response to a received power control signal representing a required output power of the RF output signal and by a first DC/DC converter 130 to select one of said n+1 voltage levels as the supply voltage for said unit 110 in response to the result of a comparison between the envelope signaland said n threshold values.

11 Claims, 6 Drawing Sheets

POWER AMPLIFIER

The invention relates to a power amplifier according to the preamble of claim 1 using a dynamic envelope tracking technique. The power amplifier is preferably applied in mobile communication modules provided in both cellular/wireless communication terminals or base stations. The invention is described in the embodiments and dependent claims.

Such power amplifiers are substantially known in the art, e.g. from an article of J. Staudinger et al., "High efficiency CDMA RF power amplifier using dynamic envelope tracking technique" in Proc. of EEE MTT-S International Microwave Symposium Digest, Boston, Mass., USA, 11–16 June, vol. 2, pages 873–876, 2000. The power amplifier disclosed in said article is shown in FIG. 6. It comprises a radio frequency RF power amplifying unit 610 for generating a RF output signal by amplifying a received RF input signal. Said power amplifier further comprises an envelope detector 620 for also receiving the RF input signal and for generating an envelope signal representing the effective value of said RF input signal. Said envelope signal is input into a DC/DC converter 630 for providing a supply voltage for said RF power amplifying unit 610 in response to said envelope signal. In that way enhanced efficiency of the power amplifier and in particular of the RF power amplifying unit is achieved at a specified linearity.

The envelope signal of the RF input signal shows fast variations. For 3rd. generation handsets the variations lie at a rate of about 4 MHz with peak to average ratios ranging from 4 dB to 12 dB or more. Methods, such as envelope tracking on which the power amplifier in FIG. 6 is based, rely on the fact that the DC/DC converter 630 in FIG. 6 is able to provide a high switching frequency for generating the supply voltage for the RF power amplifying unit 610. However, high switching frequencies however lead to undesired high losses and consequently to a low efficiency of the whole power amplifier.

Starting from that prior art it is the object of the present invention to improve a known power amplifier with respect to its efficiency by simultaneously enabling an adaptation of a supply voltage for a RF power amplifying unit of said power amplifier to fast variations of the envelope of the RF input signal.

This object is solved by the subject matter of claim 1. More specifically, the object is solved for the known power amplifier by providing a second DC/DC converter for generating a variety of n+1 voltage levels and n threshold values both in response to a received power control signal representing a required output power of the RF output signal of the RF power amplifying unit and in that the first DC/DC converter is embodied to select one of said n+1 voltage levels as said supply voltage for said RF power amplifying unit in response to the result of a comparison between the envelope signal and said n threshold values.

Advantageously, according to the invention, the provision of the voltage levels is separated from envelope tracking. Expressed in other words, the second DC/DC converter which provides the voltage levels has not to follow the envelope of the RF input signal. Thus, during operation the second DC/DC converter does not show high losses due to high switching frequencies and its efficiency is rather high.

The present invention primarily aims to maximise the efficiency of the RF power amplifying unit, which is defined by the ratio between the power of the output signal (RF out) and the DC-power provided by the first DC/DC converter, represented by its output supply voltage VccDY. However, advantageously, by maximising the efficiency of the RF power amplifying unit simultaneously the efficiency of the whole power amplifier is increased, said efficiency being defined by a ratio between the power of the output signal of the RF power amplifying unit and the DC-power provided by an external power supply, represented by the external voltage Vccext.

In contrast to the second converter, the first DC/DC converter is embodied to operate very fast. According to the invention this is achieved by outsourcing the provision of the voltage levels to the second DC/DC converter. Consequently, it is not the task of the first DC/DC converter to generate the voltage levels but it has to select one of these in response to the result of a comparison between the envelope signal and said n threshold values. Only said selection without the provision of the voltage levels can be done in a very fast manner.

According to the invention a separate provision of the voltage levels and a separate envelope tracking is combined within the power amplifier. Due to that combination the power amplifier fullfills both, high efficiency and speed requirements defined by modern telecommunication standards.

According to a first embodiment of the invention not only the collector or drain of the RF power amplifying unit is biased by the supply voltage but also the base of said RF amplifying unit is biased in response to the envelope of the RF input signal. This has the advantage that the efficiency of the RF amplifying unit is further improved.

According to another embodiment the RF amplifying unit comprises several amplifier stages which are individually switchable on or off in order to maximise the efficiency of the power amplifier. Moreover, the adaptive collector/drain and/or base biasing and envelope tracking can be switched off in the case that the power of the RF output signal is below a predetermined threshold value as it then dissipates more power than it saves. In that case it could be used only stage switching.

Finally, a predistortion unit may be provided for predistorting the RF input signal before being input into the RF amplifier unit in such a way that distortions generated by said RF amplifying unit are substantially reduced.

Further advantages embodiments of the converters are subject matter of the dependant claims.

The description is accompanied by seven figures wherein

In the following, preferred embodiments of the invention will be described by referring to FIGS. 1 to 5.

Figure 1:
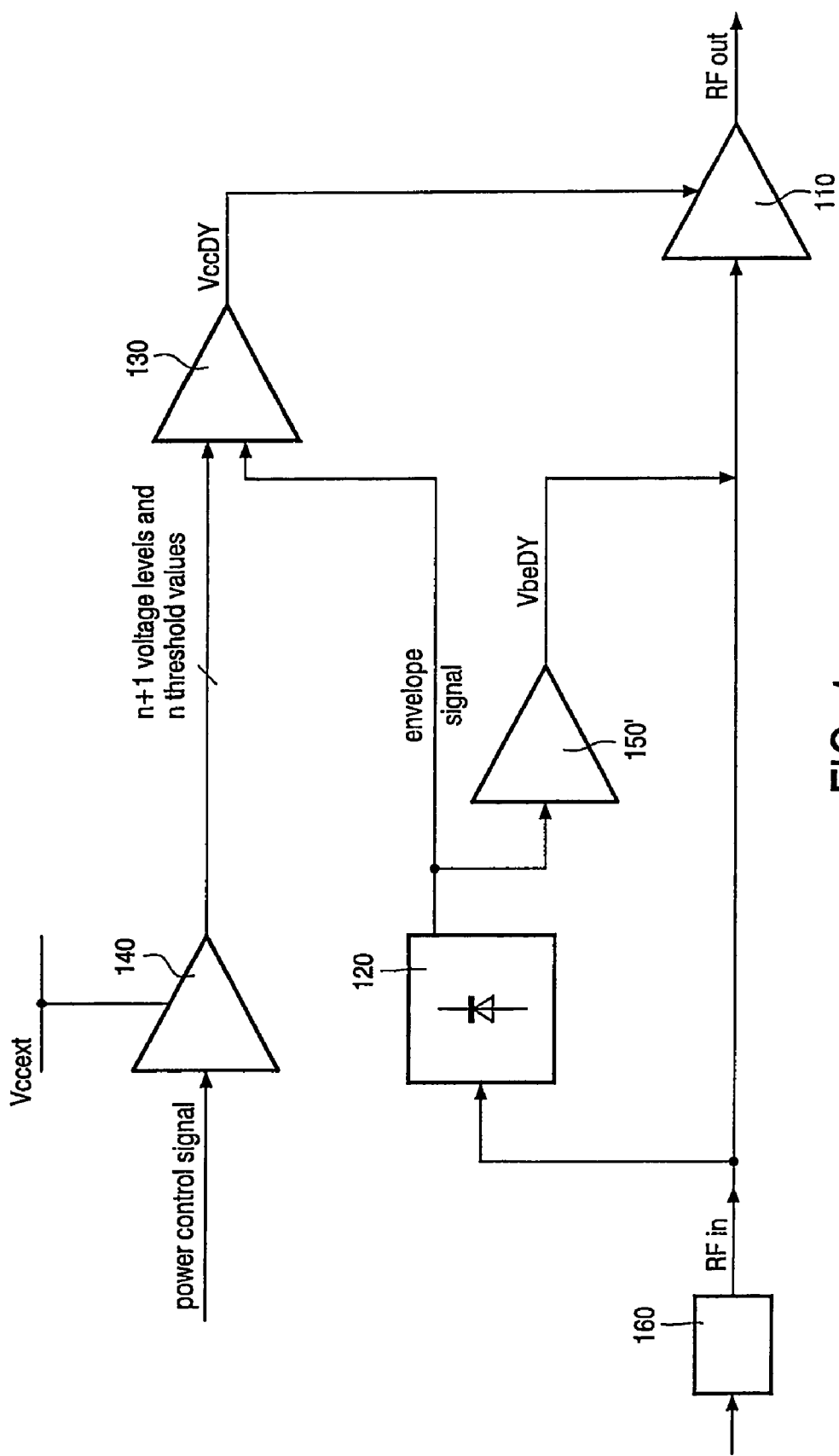
FIG. 1 shows a first embodiment of the power amplifier according to the invention.

FIG. 1 shows a first embodiment of the power amplifier according to the invention. Said power amplifier comprises a RF power amplifying unit 110 for amplifying a received RF input signal and generating into a RF output signal. In order to achieve maximal efficiency of said RF amplifying unit 110 it's supply voltage VccDY is controlled with respect to the required power of the RF signal output by said RF power amplifying unit 110 and additionally with respect to the envelope of the RF input signal.

The control of the power amplifier comprises an envelope detector 120 for detecting the envelope of the RF input signal and generating a corresponding envelope signal. Said envelope signal is input into a first DC/DC converter 130 for providing said supply voltage VccDY for said RF power amplifying unit 110. Said first DC/DC converter 130 further receives n+1 voltage levels and n threshold values both provided by a second DC/DC converter 140 in response to a power control signal representing the required output power of the RF signal output by said RF power amplifying unit 110. Said output power is externally predetermined, e.g. by a base station of a telecommunication system. The second DC/DC converter 140 generates said n+1 voltage levels for a required output power level by switching its supply voltage Vccext at a relatively low frequency for diminishing the losses due to high frequency switching. Consequently, the efficiency of said second DC/DC converter 140 is relatively high.

The power amplifier according to FIG. 1 further comprises a predistortion unit 160 for predistorting the RF input signal before being input to the RF amplifying unit 110 in such a way that distortions generated by said. RF amplifying unit 110 due to internal non-linearities are diminishing. However, due to the fast variations in the biasing, the characteristics and the non-linearities of the unit 110 may vary at some rate. Therefore, a fast feedback (not shown) to adapt a predistortion algorithm within the predistortion unit 160 to the characteristics of the unit 110 is required.

Figure 2:
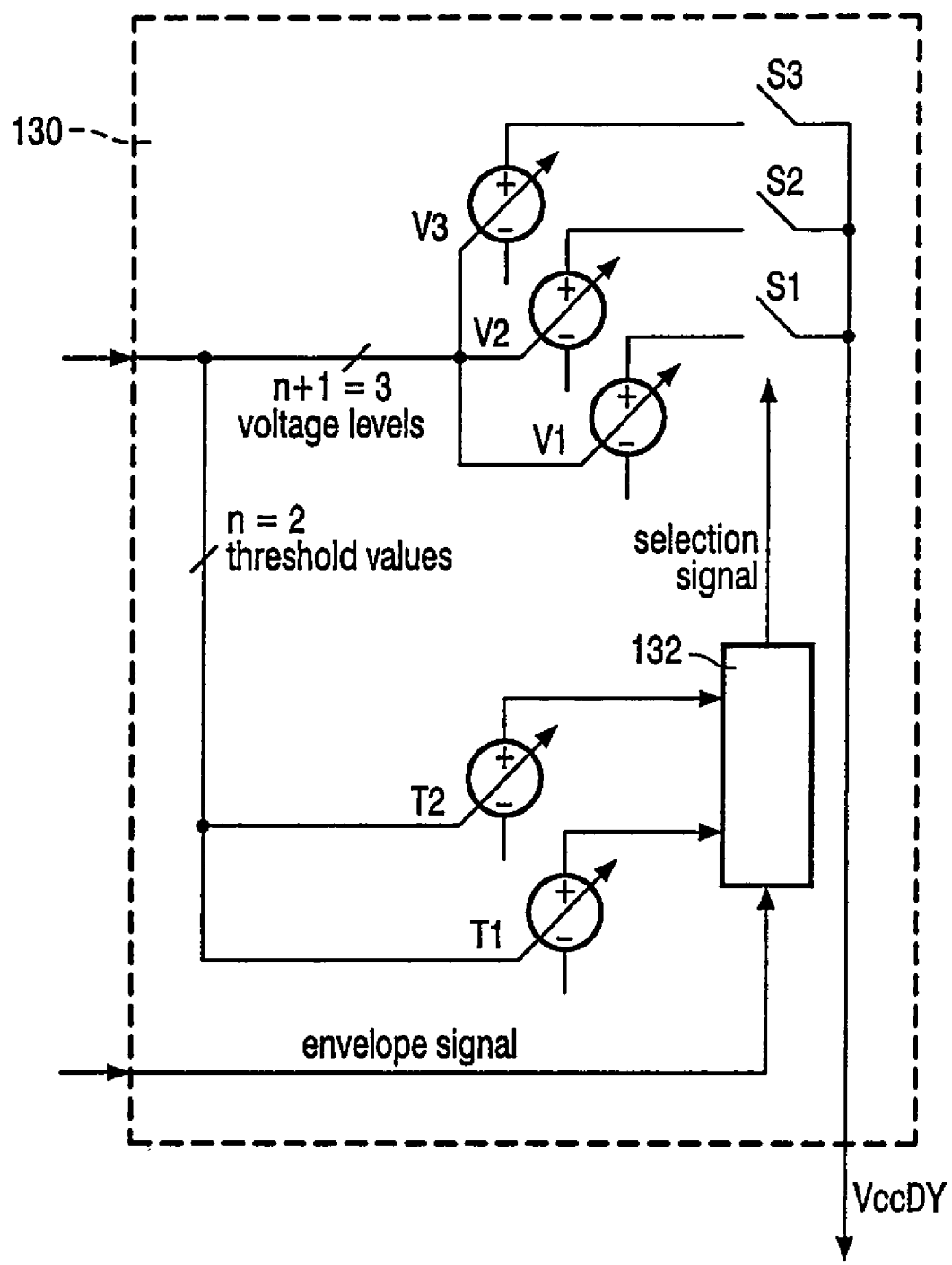
FIG. 2 shows a detailed illustration of the first DC/DC converter in the first and a second embodiment of the power amplifier.

The operation of the first DC/DC converter 130 is now explained with reference to FIG. 2. The first DC/DC converter 130 comprises a logic unit 132 for receiving the envelope signal provided by the envelope detector 120 as well as said n threshold values provided by said second DC/DC converter 140 for carrying out a comparison between the envelope signal and said threshold values T1 . . . Tn. In FIG. 2 n=2 although in general the number n can be chosen arbitrarily. When carrying out the comparison the logic unit 132 checks the correlation between the amplitude or the effective value of the envelope signal and said threshold values, i.e. it checks if the amplitude of the envelope signal is either i) below T1 or ii) between T1 and T2 with T2>T1 or iii) if it exceeds T2. In case i) the voltage level V1 provided by the second DC/DC converter 140 is selected as the supply voltage VccDY for the RF power amplifying unit 110. To the contrary, in case ii) the voltage level V2 and in case iii) the voltage level V3 is selected as supply voltage VccDY. The selection is carried out by the logic unit 132 by switching ON one of switches S1 . . . S3 which controls the selected voltage level via a selection signal, the remaining switches being switched OFF.

The voltage levels V1, V2 and V3 are provided such that the supply voltage VccDY is large enough to guarantee the linearity of the power amplifier; the voltage levels are further provided or chosen with respect to the currently required output power level. Moreover, the threshold values T1 . . . Tn, are chosen for allowing enough time for the logic unit 132 to switch the supply voltage to the most appropriate voltage level.

In general, according to the invention the threshold levels T1 . . . Tn and the provided voltage levels V1 . . . Vn are varied dynamically according to predetermined average power requirements for the RF signal output of said RF amplifying unit 110.

Due to the limited number of voltage levels V1 . . . Vn the selection of the supply voltage from these voltage levels could be accomplished by the logic unit 132 in a fast and effective way. Fast switching i.e. selection of the voltage levels ensures that the selected supply voltage for the unit 110 covers relatively large dynamic range. Moreover, because the n+1 voltage levels are provided by the second DC/DC converter 140 in accordance to the required output power, the finally selected supply voltage is appropriate to the required output power. Expressed in other words, the logic unit 132 and the switches S1, S2 and S3 for selecting one of the provided voltage levels as supply voltage for the unit 110 are designed to implement an envelope tracking technique based on a limited dynamic range, the envelope signal having fast variations. To the contrary, the second DC/DC converter 140 operates relatively efficient when it generates a most appropriate variety of voltage levels in order to achieve a maximal dynamic range in the supply voltage for relatively slow changing output power requirements.

Referring back to FIG. 1 the efficiency of the power amplifier is further increased by biasing the base of the RF amplifying unit 110. The invention proposes two alternatives for realizing such a base biasing, a first one is shown in FIG. 1 whereas a second one is shown in FIG. 3.

According to FIG. 1 the base biasing is realized by adding a base biasing voltage VbeDY to the RF input signal. Said base biasing voltage is provided by a third DC/DC converter 150' in response to the effective value of the envelope of the RF input signal.

Figure 3:
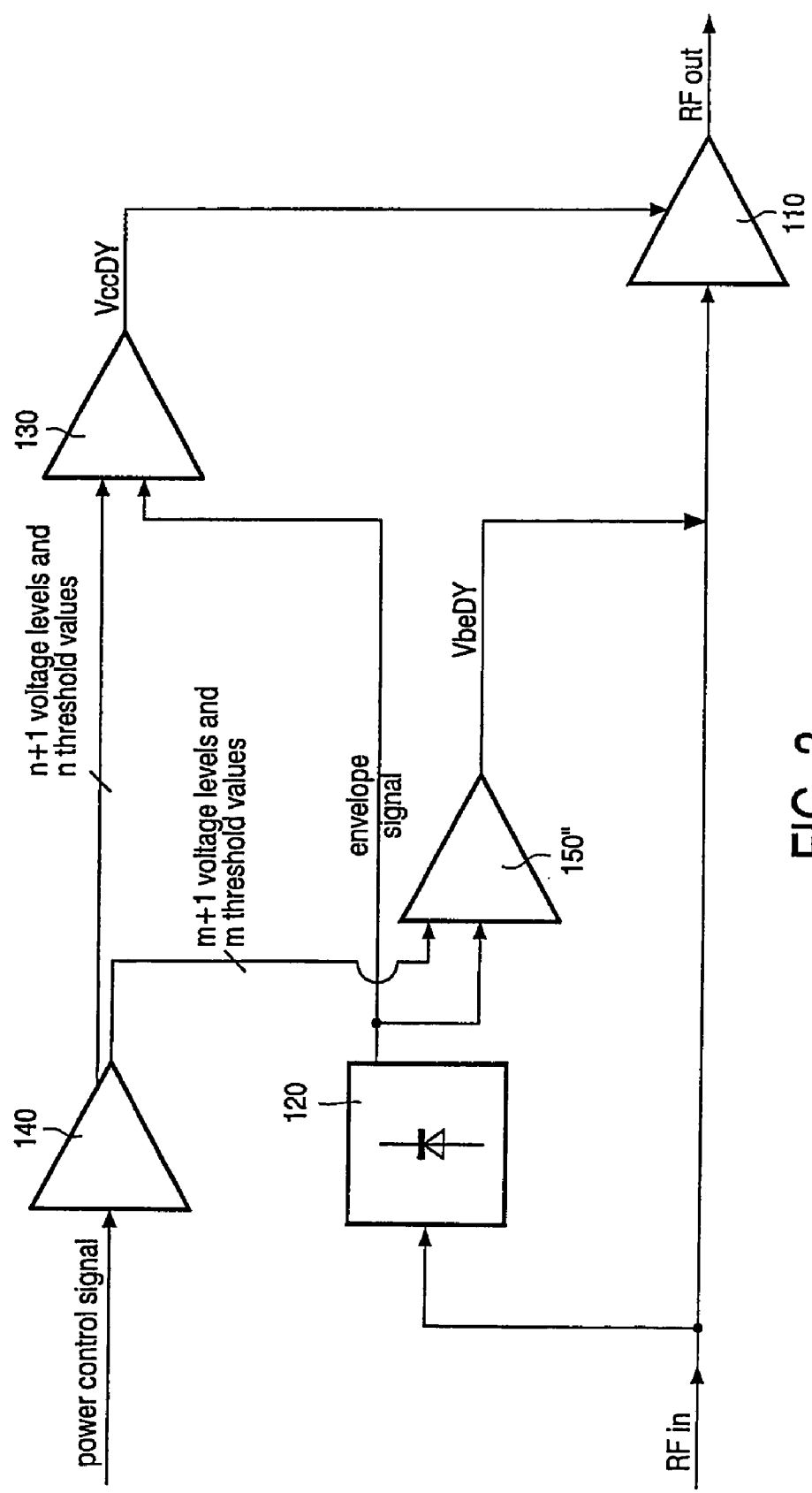
FIG. 3 shows the second embodiment of the power amplifier according to the invention.

FIG. 3 illustrates the second embodiment of the power amplifier according to the invention. It substantially corresponds to the embodiment shown in FIG. 1. However, the base biasing voltage VbeDY is generated in another way. According to FIG. 3 said base biasing voltage is generated similarly as the supply voltage for the RF amplifying unit 110. More specifically, the second DC/DC converter 140 further generates m+1 voltage levels and m threshold values for the third DC/DC converter 150" in response to the power control signal representing the required output power of the RF signal-outputted by said unit 110. Further, the envelope signal is input into said third DC/DC converter 150".

Figure 4:
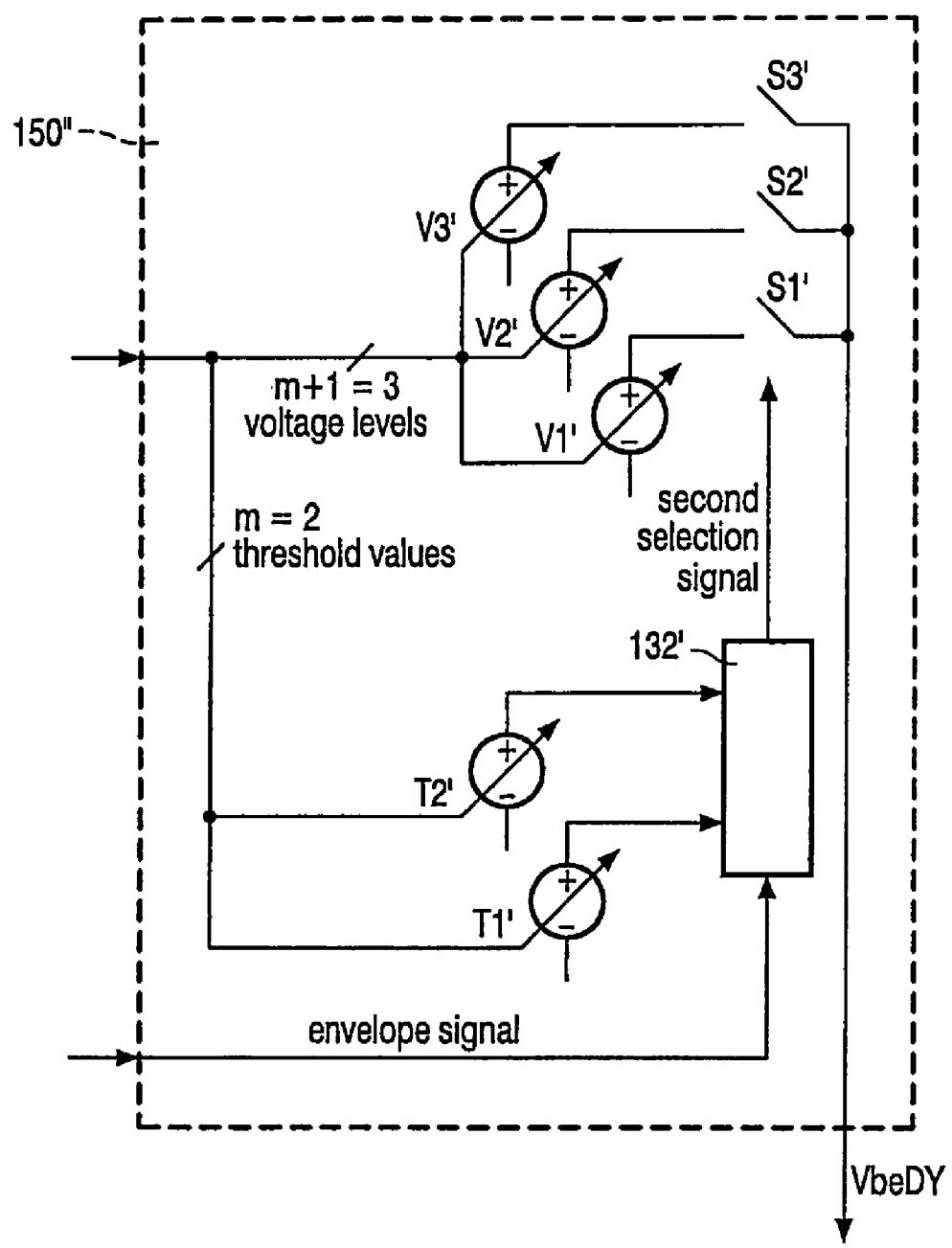
FIG. 4 shows a detailed illustration of the third DC/DC converter as used in the second embodiment of the power amplifier.

The operation of said third DC/DC converter 150" in said second embodiment for generating the base biasing voltage VbeDY is illustrated in FIG. 4. The operation substantially corresponds to the operation of the first DC/DC converter 130 described above by referring to FIG. 2. However, there are m threshold values and m+1 voltage levels provided by said second DC/DC converter 140, wherein in FIG. 2 m=2. Furthermore the base biasing voltage VbeDY is generated.

In both embodiments for generating the base biasing voltage VbeDY, shown in FIG. 1 and in FIG. 3, the controlled base biasing voltage VbeDY is used for further enhancing the efficiency of the whole power amplifier and in particular of the RF amplifying unit 110.

Figure 5:
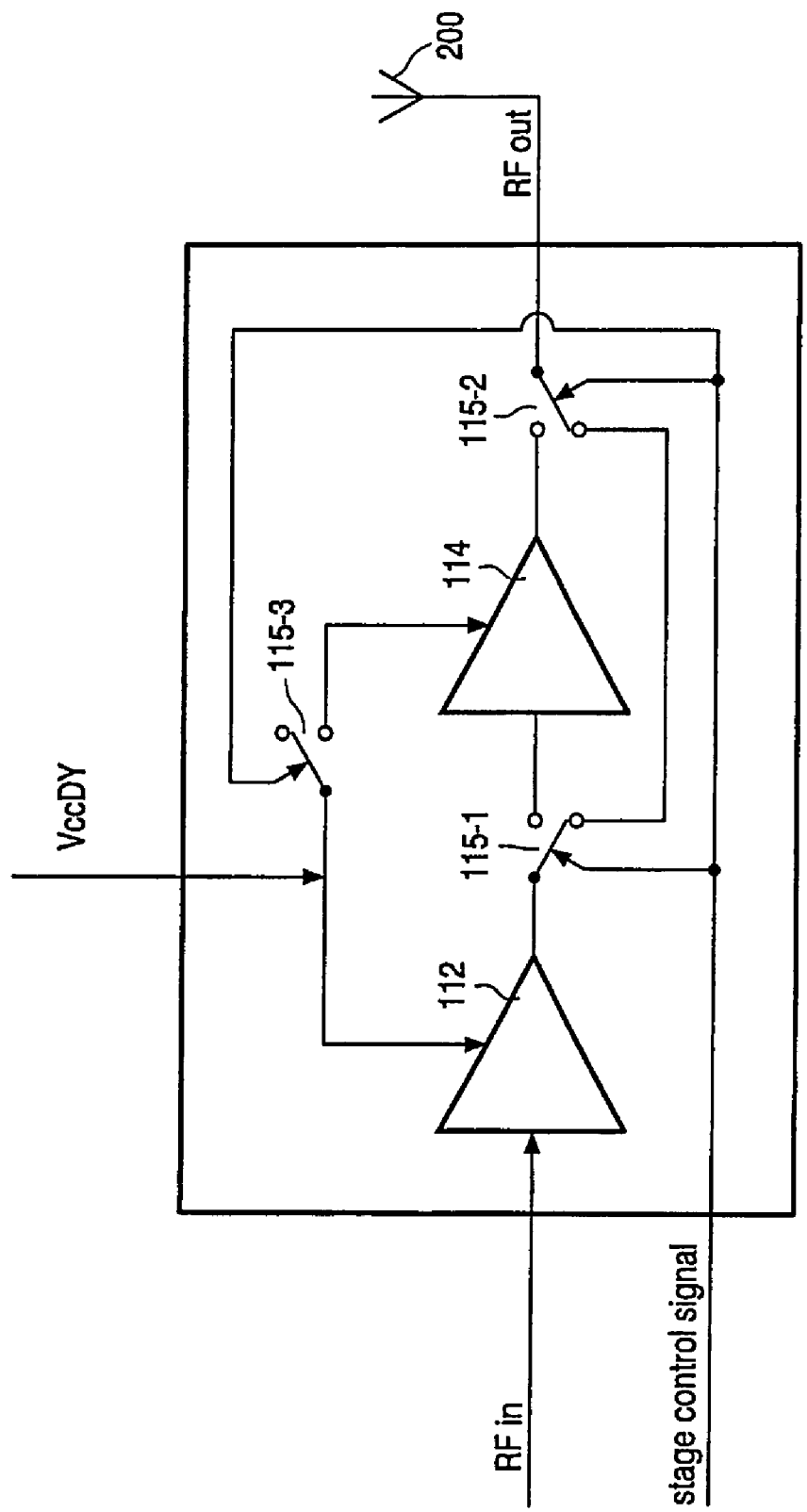
FIG. 5 shows an embodiment of the RF amplifying unit according to the invention.
Figure 6:
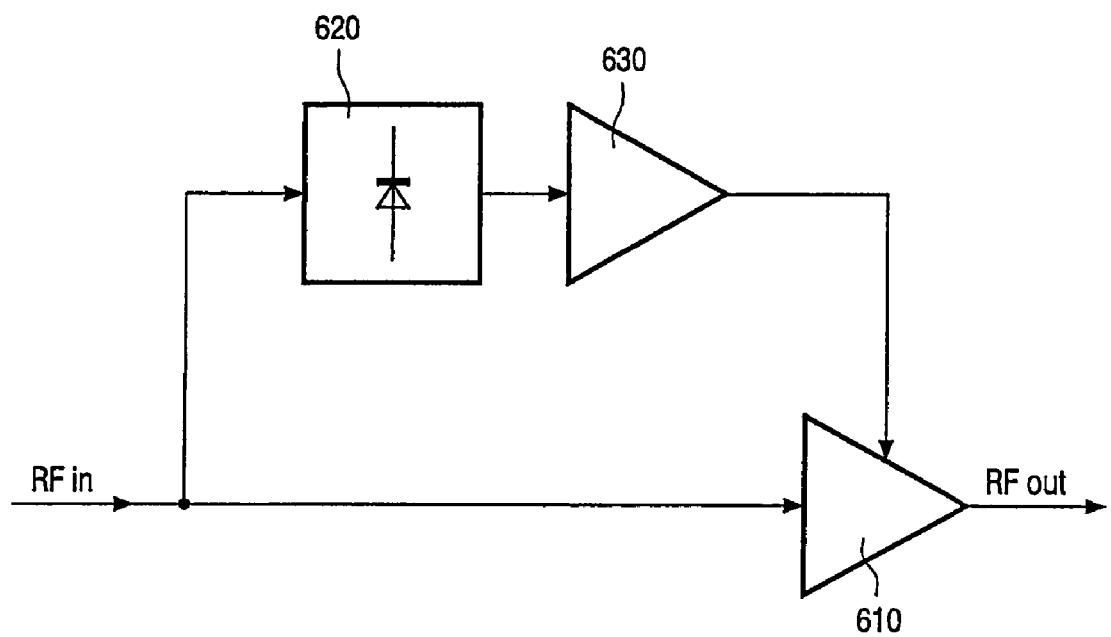
FIG. 6 shows a power amplifier as known in the art.
Figure 7:
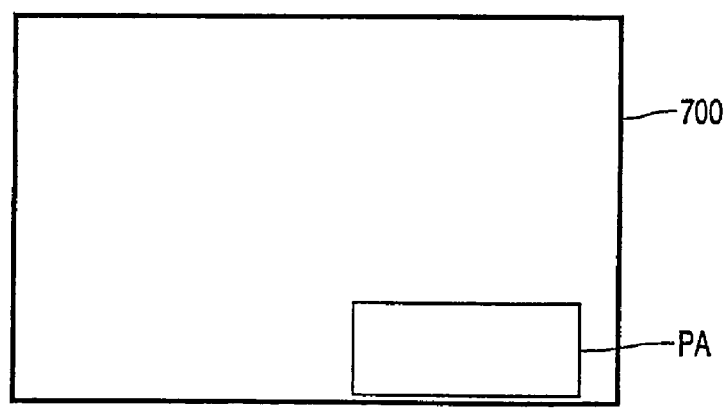
FIG. 7 shows a mobile phone comprising a power amplifier according to the invention.

FIG. 5 shows an embodiment of the RF amplifying unit 110 having two amplifier stages 112, 114. Where the required output power of the RF output signal is below a first predetermined power threshold value the second DC/DC converter 140 generates—in response to the power control signal—a stage control signal determinig a switching off of stage 114 via a switch 115-3 for maximizing the efficiency of the whole power amplifier.

The switched offstage 114 is by-passed for determining the input signal to reach the output. The by-passing is enabled by controlling switches 115-1 and 115-2 via said stage control signal. Whenever at least one amplifier is switched-OFF, the envelope tracking technique for providing the appropriate supply voltage VccDY and the adaptive base biasing are adapted to maximise the efficiency of the remaining switched-on stages, the first stage 112, corresponding to the RF power amplifying unit 110, in FIG. 5.

In general the RF amplifying unit 110 could comprise an arbitrary number k of amplifier stages that could be switched ON or OFF, individually. However, every stage that is switched off has to be by-passed allowing the input signal to reach the output.

At even lower required output power levels, i.e. as long as the required output power is below a second predetermined power threshold value, the first DC/DC converter 130 conceived to select a fixed voltage level provided by said second DC/DC converter 140 as supply voltage for said RF power amplifying unit 110. The amplifier stages 112, 114 of the RF amplifying unit 110 could be separately switched ON or OFF in order to maximise the efficiency of the unit 110 with respect to a specific required output power.

In any case, the RF output signal is outputted to an antenna 200.

What is claimed is:

1. A power amplifier comprising:
   a RF power amplifying unit (110) for generating a RF output signal by amplifying a received RF input signal;
   an envelope detector (120) for generating an envelope signal representing the envelope of said RF input signal; and
   a first DC/DC converter (130) for providing a supply voltage VccDy for said RF power amplifying unit (110) in response to said envelope signal;
   characterized in that the power amplifier further comprises:
   a second DC/DC converter (140) for generating a variety of n+1 voltage levels (V1 . . . Vn+1) and n threshold values (T1 . . . Tn) both in response to a received power control signal representing a required output power of the RF output signal of the RF power amplifying unit (110);
   the first DC/DC converter (130) conceived to select one of said n+1 voltage levels (V1 . . . Vn+1) as said supply voltage for said RF power amplifying unit (110) in response to a comparison between the envelope signal and said n threshold values (T1 . . . Tn).

2. A power amplifier according to claim 1, wherein the first DC/DC converter (130) comprises a first logic unit (132) for carrying out the comparison between the envelope signal and said threshold values (T1 . . . Tn) and for generating a selection signal in response to the result of said comparison, the selection signal being used to select the supply voltage for the RF power amplifying unit (110) from the variety of n+1 voltage levels (V1 . . . Vn+1) provided by thed second DC/DC converter (140).

3. A power amplifier according to claim 1, having a third DC/DC converter (150', 150") for providing a base biasing voltage to the base of said RF power amplifying unit (110) in response to said envelope signal.

4. A power amplifier according to claim 3, wherein the third DC/DC converter (150') is conceived to provide the base biasing voltage continuously controlled in response to the effective value of the envelope signal.

5. A power amplifier according to claim 3, wherein
   the second DC/DC converter (140) additionally generates a variety of m+1 voltages levels (V'1 . . . V'm+1) and m threshold values (T'1 . . . T'm) both also in response to the power control signal representing the required output power of the RF output signal of the RF power amplifying unit (110); and
   the third DC/DC converter (150") is conceived to select one of said m+1 voltage levels (V'1 . . . V'm+1) as said base biasing voltage VbeDY for the base of said RF power amplifying unit (110) in response to the result of a comparison between the envelope signal and said m threshold values (T'1 . . . T'm).

6. A power amplifier according to claim 5, wherein the third DC/DC converter (150) comprises a second logic unit (132') conceived to carry out the comparison between the envelope signal and said m threshold values and to generate a second selection signal in response to the result of said comparison, the second selection signal being used for selecting the base biasing voltage for the base of said RF power amplifying unit (110) from said variety of m+1 voltage levels (V'1 . . . V'm+1) provided by said second DC/DC converter (140).

7. A power amplifier according to claim 1, wherein the RF power amplifying unit (110) comprises several amplifier stages (112, 114) that could individually be switched on or off.

8. A power amplifier according to claim 7, wherein the second DC/DC converter (140) generates a stage control signal for switching off at least one of said amplifier stages (112, 114) and for by-passing said switched off stage when an output power of the RF output signal is below a first predetermined power threshold value.

9. A power amplifier according to claim 7, characterized in that first DC/DC converter (130) is conceived to select a fixed voltage level provided by said second DC/DC converter (140) as supply voltage for said RF power amplifying unit (110) as long as the output power required by said power control signal is below a second predetermined power threshold value.

10. A power amplifier according to claim 1, having a predistortion unit (160) for predistoring the RF input signal before being input into the RF amplifying unit (110) for substancially reducing the distortions generated by said RF amplifying unit (110).

11. A mobile phone device 700 comprising a power amplifier (PA) as claimed in claim 1.

* * * * *